US009076456B1

(12) United States Patent
Avendano et al.

(10) Patent No.: US 9,076,456 B1
(45) Date of Patent: *Jul. 7, 2015

(54) SYSTEM AND METHOD FOR PROVIDING VOICE EQUALIZATION

(75) Inventors: Carlos Avendano, Campbell, CA (US); Carlo Murgia, Sunnyvale, CA (US)

(73) Assignee: Audience, Inc., Mountain View, CA (US)

( * ) Notice: Subject to any disclaimer, the term of this patent is extended or adjusted under 35 U.S.C. 154(b) by 425 days.

This patent is subject to a terminal disclaimer.

(21) Appl. No.: 13/432,490

(22) Filed: Mar. 28, 2012

Related U.S. Application Data

(62) Division of application No. 12/004,788, filed on Dec. 21, 2007, now Pat. No. 8,180,064.

(51) Int. Cl.
| | |
|---|---|
| *H04B 15/00* | (2006.01) |
| *G10L 21/0232* | (2013.01) |
| *H03G 3/20* | (2006.01) |
| *H03G 3/32* | (2006.01) |

(52) U.S. Cl.
CPC .............. *G10L 21/0232* (2013.01); *H03G 3/32* (2013.01)

(58) Field of Classification Search
CPC .. G10L 21/0232; H04R 3/005; H04R 25/407; H04R 2225/43; H03G 3/32; H03G 5/165; H03G 9/025; H04M 3/18; H04S 2420/01
USPC ............ 381/73.1, 71.1–71.8, 94.1–94.4, 103, 381/98, 120, 110; 704/233
See application file for complete search history.

(56) References Cited

U.S. PATENT DOCUMENTS

| | | | |
|---|---|---|---|
| 3,976,863 | A | 8/1976 | Engel |
| 3,978,287 | A | 8/1976 | Fletcher et al. |
| 4,137,510 | A | 1/1979 | Iwahara |
| 4,433,604 | A | 2/1984 | Ott |
| 4,516,259 | A | 5/1985 | Yato et al. |
| 4,535,473 | A | 8/1985 | Sakata |

(Continued)

FOREIGN PATENT DOCUMENTS

| | | |
|---|---|---|
| JP | 62110349 | 5/1987 |
| JP | 4184400 | 7/1992 |

(Continued)

OTHER PUBLICATIONS

Allen, Jont B. "Short Term Spectral Analysis, Synthesis, and Modification by Discrete Fourier Transform", IEEE Transactions on Acoustics, Speech, and Signal Processing. vol. ASSP-25, No. 3, Jun. 1977. pp. 235-238.

(Continued)

*Primary Examiner* — Vivian Chin
*Assistant Examiner* — Ammar Hamid
(74) *Attorney, Agent, or Firm* — Carr & Ferrell LLP

(57) ABSTRACT

Systems and methods for providing voice equalization are provided. In exemplary embodiments, acoustic signals are received from both a near-end and a far-end environment. A power spectrum estimate for the far-end signal and a noise estimate based on the near-end signal are determined. A voice equalization mask based on the power spectrum estimate of the far-end signal and the noise estimate based on the near-end signal is generated and applied to the far-end signal to obtain a modified signal. The modified signal may then be dynamically processed to obtain an enhanced audio signal. The enhanced audio signal is then output.

20 Claims, 8 Drawing Sheets

(56) References Cited

U.S. PATENT DOCUMENTS

| | | |
|---|---|---|
| 4,536,844 A | 8/1985 | Lyon |
| 4,581,758 A | 4/1986 | Coker et al. |
| 4,628,529 A | 12/1986 | Borth et al. |
| 4,630,304 A | 12/1986 | Borth et al. |
| 4,649,505 A | 3/1987 | Zinser, Jr. et al. |
| 4,658,426 A | 4/1987 | Chabries et al. |
| 4,674,125 A | 6/1987 | Carlson et al. |
| 4,718,104 A | 1/1988 | Anderson |
| 4,811,404 A | 3/1989 | Vilmur et al. |
| 4,812,996 A | 3/1989 | Stubbs |
| 4,864,620 A | 9/1989 | Bialick |
| 4,920,508 A | 4/1990 | Yassaie et al. |
| 5,027,410 A | 6/1991 | Williamson et al. |
| 5,054,085 A | 10/1991 | Meisel et al. |
| 5,058,419 A | 10/1991 | Nordstrom et al. |
| 5,099,738 A | 3/1992 | Hotz |
| 5,119,711 A | 6/1992 | Bell et al. |
| 5,142,961 A | 9/1992 | Paroutaud |
| 5,150,413 A | 9/1992 | Nakatani et al. |
| 5,175,769 A | 12/1992 | Hejna, Jr. et al. |
| 5,187,776 A | 2/1993 | Yanker |
| 5,208,864 A | 5/1993 | Kaneda |
| 5,210,366 A | 5/1993 | Sykes, Jr. |
| 5,224,170 A | 6/1993 | Waite, Jr. |
| 5,230,022 A | 7/1993 | Sakata |
| 5,319,736 A | 6/1994 | Hunt |
| 5,323,459 A | 6/1994 | Hirano |
| 5,341,432 A | 8/1994 | Suzuki et al. |
| 5,381,473 A | 1/1995 | Andrea et al. |
| 5,381,512 A | 1/1995 | Holton et al. |
| 5,400,409 A | 3/1995 | Linhard |
| 5,402,493 A | 3/1995 | Goldstein |
| 5,402,496 A | 3/1995 | Soli et al. |
| 5,471,195 A | 11/1995 | Rickman |
| 5,473,702 A | 12/1995 | Yoshida et al. |
| 5,473,759 A | 12/1995 | Slaney et al. |
| 5,479,564 A | 12/1995 | Vogten et al. |
| 5,502,663 A | 3/1996 | Lyon |
| 5,544,250 A | 8/1996 | Urbanski |
| 5,574,824 A | 11/1996 | Slyh et al. |
| 5,583,784 A | 12/1996 | Kapust et al. |
| 5,587,998 A | 12/1996 | Velardo, Jr. et al. |
| 5,590,241 A | 12/1996 | Park et al. |
| 5,602,962 A | 2/1997 | Kellermann |
| 5,675,778 A | 10/1997 | Jones |
| 5,682,463 A | 10/1997 | Allen et al. |
| 5,694,474 A | 12/1997 | Ngo et al. |
| 5,706,395 A | 1/1998 | Arslan et al. |
| 5,717,829 A | 2/1998 | Takagi |
| 5,729,612 A | 3/1998 | Abel et al. |
| 5,732,189 A | 3/1998 | Johnston et al. |
| 5,749,064 A | 5/1998 | Pawate et al. |
| 5,757,937 A | 5/1998 | Itoh et al. |
| 5,792,971 A | 8/1998 | Timis et al. |
| 5,796,819 A | 8/1998 | Romesburg |
| 5,806,025 A | 9/1998 | Vis et al. |
| 5,809,463 A | 9/1998 | Gupta et al. |
| 5,825,320 A | 10/1998 | Miyamori et al. |
| 5,839,101 A | 11/1998 | Vahatalo et al. |
| 5,920,840 A | 7/1999 | Satyamurti et al. |
| 5,933,495 A | 8/1999 | Oh |
| 5,943,429 A | 8/1999 | Handel |
| 5,956,674 A | 9/1999 | Smyth et al. |
| 5,974,380 A | 10/1999 | Smyth et al. |
| 5,978,824 A | 11/1999 | Ikeda |
| 5,983,139 A | 11/1999 | Zierhofer |
| 5,990,405 A | 11/1999 | Auten et al. |
| 6,002,776 A | 12/1999 | Bhadkamkar et al. |
| 6,061,456 A | 5/2000 | Andrea et al. |
| 6,072,881 A | 6/2000 | Linder |
| 6,097,820 A | 8/2000 | Turner |
| 6,108,626 A | 8/2000 | Cellario et al. |
| 6,122,610 A | 9/2000 | Isabelle |
| 6,134,524 A | 10/2000 | Peters et al. |
| 6,137,349 A | 10/2000 | Menkhoff et al. |
| 6,140,809 A | 10/2000 | Doi |
| 6,173,255 B1 | 1/2001 | Wilson et al. |
| 6,180,273 B1 | 1/2001 | Okamoto |
| 6,216,103 B1 | 4/2001 | Wu et al. |
| 6,222,927 B1 | 4/2001 | Feng et al. |
| 6,223,090 B1 | 4/2001 | Brungart |
| 6,226,616 B1 | 5/2001 | You et al. |
| 6,263,307 B1 | 7/2001 | Arslan et al. |
| 6,266,633 B1 | 7/2001 | Higgins et al. |
| 6,317,501 B1 | 11/2001 | Matsuo |
| 6,339,758 B1 | 1/2002 | Kanazawa et al. |
| 6,355,869 B1 | 3/2002 | Mitton |
| 6,363,345 B1 | 3/2002 | Marash et al. |
| 6,381,570 B2 | 4/2002 | Li et al. |
| 6,430,295 B1 | 8/2002 | Handel et al. |
| 6,434,417 B1 | 8/2002 | Lovett |
| 6,449,586 B1 | 9/2002 | Hoshuyama |
| 6,469,732 B1 | 10/2002 | Chang et al. |
| 6,487,257 B1 | 11/2002 | Gustafsson et al. |
| 6,496,795 B1 | 12/2002 | Malvar |
| 6,513,004 B1 | 1/2003 | Rigazio et al. |
| 6,516,066 B2 | 2/2003 | Hayashi |
| 6,529,606 B1 | 3/2003 | Jackson, Jr. II et al. |
| 6,549,630 B1 | 4/2003 | Bobisuthi |
| 6,584,203 B2 | 6/2003 | Elko et al. |
| 6,622,030 B1 | 9/2003 | Romesburg et al. |
| 6,717,991 B1 | 4/2004 | Gustafsson et al. |
| 6,718,309 B1 | 4/2004 | Selly |
| 6,738,482 B1 | 5/2004 | Jaber |
| 6,760,450 B2 | 7/2004 | Matsuo |
| 6,785,381 B2 | 8/2004 | Gartner et al. |
| 6,792,118 B2 | 9/2004 | Watts |
| 6,795,558 B2 | 9/2004 | Matsuo |
| 6,798,886 B1 | 9/2004 | Smith et al. |
| 6,810,273 B1 | 10/2004 | Mattila et al. |
| 6,882,736 B2 | 4/2005 | Dickel et al. |
| 6,915,264 B2 | 7/2005 | Baumgarte |
| 6,917,688 B2 | 7/2005 | Yu et al. |
| 6,944,510 B1 | 9/2005 | Ballesty et al. |
| 6,978,159 B2 | 12/2005 | Feng et al. |
| 6,982,377 B2 | 1/2006 | Sakurai et al. |
| 6,999,582 B1 | 2/2006 | Popovic et al. |
| 7,016,507 B1 | 3/2006 | Brennan |
| 7,020,605 B2 | 3/2006 | Gao |
| 7,031,478 B2 | 4/2006 | Belt et al. |
| 7,054,452 B2 | 5/2006 | Ukita |
| 7,065,485 B1 | 6/2006 | Chong-White et al. |
| 7,076,315 B1 | 7/2006 | Watts |
| 7,092,529 B2 | 8/2006 | Yu et al. |
| 7,092,882 B2 | 8/2006 | Arrowood et al. |
| 7,099,821 B2 | 8/2006 | Visser et al. |
| 7,142,677 B2 | 11/2006 | Gonopolskiy et al. |
| 7,146,316 B2 | 12/2006 | Alves |
| 7,155,019 B2 | 12/2006 | Hou |
| 7,164,620 B2 | 1/2007 | Hoshuyama |
| 7,171,008 B2 | 1/2007 | Elko |
| 7,171,246 B2 | 1/2007 | Mattila et al. |
| 7,174,022 B1 | 2/2007 | Zhang et al. |
| 7,206,418 B2 | 4/2007 | Yang et al. |
| 7,209,567 B1 | 4/2007 | Kozel et al. |
| 7,225,001 B1 | 5/2007 | Eriksson et al. |
| 7,242,762 B2 | 7/2007 | He et al. |
| 7,246,058 B2 | 7/2007 | Burnett |
| 7,254,242 B2 | 8/2007 | Ise et al. |
| 7,359,520 B2 | 4/2008 | Brennan et al. |
| 7,412,379 B2 | 8/2008 | Taori et al. |
| 7,433,907 B2 | 10/2008 | Nagai et al. |
| 7,555,434 B2 | 6/2009 | Nomura et al. |
| 7,949,522 B2 | 5/2011 | Hetherington et al. |
| 8,180,064 B1 * | 5/2012 | Avendano et al. ........... 381/73.1 |
| 2001/0016020 A1 | 8/2001 | Gustafsson et al. |
| 2001/0031053 A1 | 10/2001 | Feng et al. |
| 2002/0002455 A1 | 1/2002 | Accardi et al. |
| 2002/0009203 A1 | 1/2002 | Erten |
| 2002/0041693 A1 | 4/2002 | Matsuo |
| 2002/0080980 A1 | 6/2002 | Matsuo |
| 2002/0106092 A1 | 8/2002 | Matsuo |
| 2002/0116187 A1 | 8/2002 | Erten |
| 2002/0133334 A1 | 9/2002 | Coorman et al. |

(56) References Cited

U.S. PATENT DOCUMENTS

| | | |
|---|---|---|
| 2002/0147595 A1 | 10/2002 | Baumgarte |
| 2002/0184013 A1 | 12/2002 | Walker |
| 2003/0014248 A1 | 1/2003 | Vetter |
| 2003/0026437 A1 | 2/2003 | Janse et al. |
| 2003/0033140 A1 | 2/2003 | Taori et al. |
| 2003/0039369 A1 | 2/2003 | Bullen |
| 2003/0040908 A1 | 2/2003 | Yang et al. |
| 2003/0061032 A1 | 3/2003 | Gonopolskiy |
| 2003/0063759 A1 | 4/2003 | Brennan et al. |
| 2003/0072382 A1 | 4/2003 | Raleigh et al. |
| 2003/0072460 A1 | 4/2003 | Gonopolskiy et al. |
| 2003/0095667 A1 | 5/2003 | Watts |
| 2003/0099345 A1 | 5/2003 | Gartner et al. |
| 2003/0101048 A1 | 5/2003 | Liu |
| 2003/0103632 A1 | 6/2003 | Goubran et al. |
| 2003/0128851 A1 | 7/2003 | Furuta |
| 2003/0138116 A1 | 7/2003 | Jones et al. |
| 2003/0147538 A1 | 8/2003 | Elko |
| 2003/0169891 A1 | 9/2003 | Ryan et al. |
| 2003/0228023 A1 | 12/2003 | Burnett et al. |
| 2004/0013276 A1 | 1/2004 | Ellis et al. |
| 2004/0047464 A1 | 3/2004 | Yu et al. |
| 2004/0057574 A1 | 3/2004 | Faller |
| 2004/0078199 A1 | 4/2004 | Kremer et al. |
| 2004/0131178 A1 | 7/2004 | Shahaf et al. |
| 2004/0133421 A1 | 7/2004 | Burnett et al. |
| 2004/0165736 A1 | 8/2004 | Hetherington et al. |
| 2004/0196989 A1 | 10/2004 | Friedman et al. |
| 2004/0263636 A1 | 12/2004 | Cutler et al. |
| 2005/0025263 A1 | 2/2005 | Wu |
| 2005/0027520 A1 | 2/2005 | Mattila et al. |
| 2005/0049864 A1 | 3/2005 | Kaltenmeier et al. |
| 2005/0060142 A1 | 3/2005 | Visser et al. |
| 2005/0152559 A1 | 7/2005 | Gierl et al. |
| 2005/0185813 A1 | 8/2005 | Sinclair et al. |
| 2005/0213778 A1 | 9/2005 | Buck et al. |
| 2005/0216259 A1 | 9/2005 | Watts |
| 2005/0228518 A1 | 10/2005 | Watts |
| 2005/0276423 A1 | 12/2005 | Aubauer et al. |
| 2005/0288923 A1 | 12/2005 | Kok |
| 2006/0072768 A1 | 4/2006 | Schwartz et al. |
| 2006/0074646 A1 | 4/2006 | Alves et al. |
| 2006/0098809 A1 | 5/2006 | Nongpiur et al. |
| 2006/0120537 A1 | 6/2006 | Burnett et al. |
| 2006/0133621 A1 | 6/2006 | Chen et al. |
| 2006/0149535 A1 | 7/2006 | Choi et al. |
| 2006/0184363 A1 | 8/2006 | McCree et al. |
| 2006/0198542 A1 | 9/2006 | Benjelloun Touimi et al. |
| 2006/0222184 A1 | 10/2006 | Buck et al. |
| 2007/0021958 A1 | 1/2007 | Visser et al. |
| 2007/0027685 A1 | 2/2007 | Arakawa et al. |
| 2007/0033020 A1 | 2/2007 | (Kelleher) Francois et al. |
| 2007/0067166 A1 | 3/2007 | Pan et al. |
| 2007/0078649 A1 | 4/2007 | Hetherington et al. |
| 2007/0094031 A1 | 4/2007 | Chen |
| 2007/0100612 A1 | 5/2007 | Ekstrand et al. |
| 2007/0116300 A1 | 5/2007 | Chen |
| 2007/0150268 A1 | 6/2007 | Acero et al. |
| 2007/0154031 A1 | 7/2007 | Avendano et al. |
| 2007/0165879 A1 | 7/2007 | Deng et al. |
| 2007/0195968 A1 | 8/2007 | Jaber |
| 2007/0230712 A1 | 10/2007 | Belt et al. |
| 2007/0276656 A1 | 11/2007 | Solbach et al. |
| 2008/0019548 A1 | 1/2008 | Avendano |
| 2008/0033723 A1 | 2/2008 | Jang et al. |
| 2008/0140391 A1 | 6/2008 | Yen et al. |
| 2008/0201138 A1 | 8/2008 | Visser et al. |
| 2008/0228478 A1 | 9/2008 | Hetherington et al. |
| 2008/0260175 A1 | 10/2008 | Elko |
| 2009/0012783 A1 | 1/2009 | Klein |
| 2009/0012786 A1 | 1/2009 | Zhang et al. |
| 2009/0129610 A1 | 5/2009 | Kim et al. |
| 2009/0220107 A1 | 9/2009 | Every et al. |
| 2009/0238373 A1 | 9/2009 | Klein |
| 2009/0253418 A1 | 10/2009 | Makinen |
| 2009/0271187 A1 | 10/2009 | Yen et al. |
| 2009/0323982 A1 | 12/2009 | Solbach et al. |
| 2010/0094643 A1 | 4/2010 | Avendano et al. |
| 2010/0278352 A1 | 11/2010 | Petit et al. |
| 2011/0178800 A1 | 7/2011 | Watts |

FOREIGN PATENT DOCUMENTS

| | | |
|---|---|---|
| JP | 5053587 | 3/1993 |
| JP | 05-172865 | 7/1993 |
| JP | 6269083 | 9/1994 |
| JP | 10-313497 | 11/1998 |
| JP | 11-249693 | 9/1999 |
| JP | 2004053895 | 2/2004 |
| JP | 2004531767 | 10/2004 |
| JP | 2004533155 | 10/2004 |
| JP | 2005110127 | 4/2005 |
| JP | 2005148274 | 6/2005 |
| JP | 2005518118 | 6/2005 |
| JP | 2005195955 | 7/2005 |
| WO | 01/74118 | 10/2001 |
| WO | 02080362 | 10/2002 |
| WO | 02103676 | 12/2002 |
| WO | 03/043374 | 5/2003 |
| WO | 03/069499 | 8/2003 |
| WO | 03069499 | 8/2003 |
| WO | 2004/010415 | 1/2004 |
| WO | 2007/081916 | 7/2007 |
| WO | 2007/140003 | 12/2007 |
| WO | 2010/005493 | 1/2010 |

OTHER PUBLICATIONS

Allen, Jont B. et al. "A Unified Approach to Short-Time Fourier Analysis and Synthesis", Proceedings of the IEEE. vol. 65, No. 11, Nov. 1977. pp. 1558-1564.

Avendano, Carlos, "Frequency-Domain Source Identification and Manipulation in Stereo Mixes for Enhancement, Suppression and Re-Panning Applications," 2003 IEEE Workshop on Application of Signal Processing to Audio and Acoustics, Oct. 19-22, pp. 55-58, New Paltz, New York, USA.

Boll, Steven F. "Suppression of Acoustic Noise in Speech using Spectral Subtraction", IEEE Transactions on Acoustics, Speech and Signal Processing, vol. ASSP-27, No. 2, Apr. 1979, pp. 113-120.

Boll, Steven F. et al. "Suppression of Acoustic Noise in Speech Using Two Microphone Adaptive Noise Cancellation", IEEE Transactions on Acoustic, Speech, and Signal Processing, vol. ASSP-28, No. 6, Dec. 1980, pp. 752-753.

Boll, Steven F. "Suppression of Acoustic Noise in Speech Using Spectral Subtraction", Dept. of Computer Science, University of Utah Salt Lake City, Utah, Apr. 1979, pp. 18-19.

Chen, Jingdong et al. "New Insights into the Noise Reduction Wiener Filter", IEEE Transactions on Audio, Speech, and Language Processing. vol. 14, No. 4, Jul. 2006, pp. 1218-1234.

Cohen, Israel et al. "Microphone Array Post-Filtering for Non-Stationary Noise Suppression", IEEE International Conference on Acoustics, Speech, and Signal Processing, May 2002, pp. 1-4.

Cohen, Israel, "Multichannel Post-Filtering in Nonstationary Noise Environments", IEEE Transactions on Signal Processing, vol. 52, No. 5, May 2004, pp. 1149-1160.

Dahl, Mattias et al., "Simultaneous Echo Cancellation and Car Noise Suppression Employing a Microphone Array", 1997 IEEE International Conference on Acoustics, Speech, and Signal Processing, Apr. 21-24, pp. 239-242.

Elko, Gary W., "Chapter 2: Differential Microphone Arrays", "Audio Signal Processing for Next-Generation Multimedia Communication Systems", 2004, pp. 12-65, Kluwer Academic Publishers, Norwell, Massachusetts, USA.

Ent 172. Instructional Module. Prince George's Community College Department of Engineering Technology. Accessed: Oct. 15, 2011. Subsection: "Polar and Rectangular Notation". <http://academic.ppgcc.edu/ent/ent172_instr_mod.html>.

Fuchs, Martin et al. "Noise Suppression for Automotive Applications Based on Directional Information", 2004 IEEE International Conference on Acoustics, Speech, and Signal Processing, May 17-21, pp. 237-240.

(56) References Cited

OTHER PUBLICATIONS

Fulghum, D. P. et al., "LPC Voice Digitizer with Background Noise Suppression", 1979 IEEE International Conference on Acoustics, Speech, and Signal Processing, pp. 220-223.

Goubran, R.A. "Acoustic Noise Suppression Using Regression Adaptive Filtering", 1990 IEEE 40th Vehicular Technology Conference, May 6-9, pp. 48-53.

Graupe, Daniel et al., "Blind Adaptive Filtering of Speech from Noise of Unknown Spectrum Using a Virtual Feedback Configuration", IEEE Transactions on Speech and Audio Processing, Mar. 2000, vol. 8, No. 2, pp. 146-158.

Haykin, Simon et al. "Appendix A.2 Complex Numbers." Signals and Systems. 2nd Ed. 2003. p. 764.

Hermansky, Hynek "Should Recognizers Have Ears?", In Proc. ESCA Tutorial and Research Workshop on Robust Speech Recognition for Unknown Communication Channels, pp. 1-10, France 1997.

Hohmann, V. "Frequency Analysis and Synthesis Using a Gammatone Filterbank", ACTA Acustica United with Acustica, 2002, vol. 88, pp. 433-442.

Jeffress, Lloyd A. et al. "A Place Theory of Sound Localization," Journal of Comparative and Physiological Psychology, 1948, vol. 41, p. 35-39.

Jeong, Hyuk et al., "Implementation of a New Algorithm Using the STFT with Variable Frequency Resolution for the Time-Frequency Auditory Model", J. Audio Eng. Soc., Apr. 1999, vol. 47, No. 4., pp. 240-251.

Kates, James M. "A Time-Domain Digital Cochlear Model", IEEE Transactions on Signal Processing, Dec. 1991, vol. 39, No. 12, pp. 2573-2592.

Lazzaro, John et al., "A Silicon Model of Auditory Localization," Neural Computation Spring 1989, vol. 1, pp. 47-57, Massachusetts Institute of Technology.

Lippmann, Richard P. "Speech Recognition by Machines and Humans", Speech Communication, Jul. 1997, vol. 22, No. 1, pp. 1-15.

Liu, Chen et al. "A Two-Microphone Dual Delay-Line Approach for Extraction of a Speech Sound in the Presence of Multiple Interferers", Journal of the Acoustical Society of America, vol. 110, No. 6, Dec. 2001, pp. 3218-3231.

Martin, Rainer et al. "Combined Acoustic Echo Cancellation, Dereverberation and Noise Reduction: A two Microphone Approach", Annales des Telecommunications/Annals of Telecommunications. vol. 49, No. 7-8, Jul.-Aug. 1994, pp. 429-438.

Martin, Rainer "Spectral Subtraction Based on Minimum Statistics", in Proceedings Europe. Signal Processing Conf., 1994, pp. 1182-1185.

Mitra, Sanjit K. Digital Signal Processing: a Computer-based Approach. 2nd Ed. 2001. pp. 131-133.

Mizumachi, Mitsunori et al. "Noise Reduction by Paired-Microphones Using Spectral Subtraction", 1998 IEEE International Conference on Acoustics, Speech and Signal Processing, May 12-15. pp. 1001-1004.

Moonen, Marc et al. "Multi-Microphone Signal Enhancement Techniques for Noise Suppression and Dereverbration," http://www.esat.kuleuven.ac.be/sista/yearreport97//node37.html, accessed on Apr. 21, 1998.

Watts, Lloyd Narrative of Prior Disclosure of Audio Display on Feb. 15, 2000 and May 31, 2000.

Cosi, Piero et al. (1996), "Lyon's Auditory Model Inversion: a Tool for Sound Separation and Speech Enhancement," Proceedings of ESCA Workshop on 'The Auditory Basis of Speech Perception,' Keele University, Keele (UK), Jul. 15-19, 1996, pp. 194-197.

Parra, Lucas et al. "Convolutive Blind Separation of Non-Stationary Sources", IEEE Transactions on Speech and Audio Processing. vol. 8, No. 3, May 2008, pp. 320-327.

Rabiner, Lawrence R. et al. "Digital Processing of Speech Signals", (Prentice-Hall Series in Signal Processing). Upper Saddle River, NJ: Prentice Hall, 1978.

Weiss, Ron et al., "Estimating Single-Channel Source Separation Masks: Revelance Vector Machine Classifiers vs. Pitch-Based Masking", Workshop on Statistical and Perceptual Audio Processing, 2006.

Schimmel, Steven et al., "Coherent Envelope Detection for Modulation Filtering of Speech," 2005 IEEE International Conference on Acoustics, Speech, and Signal Processing, vol. 1, No. 7, pp. 221-224.

Slaney, Malcom, "Lyon's Cochlear Model", Advanced Technology Group, Apple Technical Report #13, Apple Computer, Inc., 1988, pp. 1-79.

Slaney, Malcom, et al. "Auditory Model Inversion for Sound Separation," 1994 IEEE International Conference on Acoustics, Speech and Signal Processing, Apr. 19-22, vol. 2, pp. 77-80.

Slaney, Malcom. "An Introduction to Auditory Model Inversion", Interval Technical Report IRC 1994-014, http://coweb.ecn.purdue.edu/~maclom/interval/1994-014/, Sep. 1994, accessed on Jul. 6, 2010.

Solbach, Ludger "An Architecture for Robust Partial Tracking and Onset Localization in Single Channel Audio Signal Mixes", Technical University Hamburg-Harburg, 1998.

Stahl, V. et al., "Quantile Based Noise Estimation for Spectral Subtraction and Wiener Filtering," 2000 IEEE International Conference on Acoustics, Speech, and Signal Processing, Jun. 5-9, vol. 3, pp. 1875-1878.

Syntrillium Software Corporation, "Cool Edit User's Manual", 1996, pp. 1-74.

Tashev, Ivan et al. "Microphone Array for Headset with Spatial Noise Suppressor", http://research.microsoft.com/users/ivantash/Documents/Tashev_MAforHeadset_HSCMA_05.pdf. (4 pages).

Tchorz, Jurgen et al., "SNR Estimation Based on Amplitude Modulation Analysis with Applications to Noise Suppression", IEEE Transactions on Speech and Audio Processing, vol. 11, No. 3, May 2003, pp. 184-192.

Valin, Jean-Marc et al. "Enhanced Robot Audition Based on Microphone Array Source Separation with Post-Filter,", Proceedings of 2004 IEEE/RSJ International Conference on Intelligent Robots and Systems, Sep. 28-Oct. 2, 2004, Sendai, Japan. pp. 2123-2128.

Watts, Lloyd, "Robust Hearing Systems for Intelligent Machines," Applied Neurosystems Corporation, 2001, pp. 1-5.

Widrow, B. et al., "Adaptive Antenna Systems," Proceedings of the IEEE, vol. 55, No. 12, pp. 2143-2159, Dec. 1967.

Yoo, Heejong et al., "Continuous-Time Audio Noise Suppression and Real-Time Implementation", 2002 IEEE International Conference on Acoustics, Speech, and Signal Processing, May 13-17, pp. IV3980-IV3983.

International Search Report dated Jun. 8, 2001 in Application No. PCT/US01/08372.

International Search Report dated Apr. 3, 2003 in Application No. PCT/US02/36946.

International Search Report dated May 29, 2003 in Application No. PCT/US03/04124.

International Search Report and Written Opinion dated Oct. 19, 2007 in Application No. PCT/US07/00463.

International Search Report and Written Opinion dated Apr. 9, 2008 in Application No. PCT/US07/21654.

International Search Report and Written Opinion dated Sep. 16, 2008 in Application No. PCT/US07/12628.

International Search Report and Written Opinion dated Oct. 1, 2008 in Application No. PCT/US08/08249.

International Search Report and Written Opinion dated May 11, 2009 in Application No. PCT/US09/01667.

International Search Report and Written Opinion dated Aug. 27, 2009 in Application No. PCT/US09/03813.

International Search Report and Written Opinion dated May 20, 2010 in Application No. PCT/US09/06754.

Fast Cochlea Transform, US Trademark Reg. No. 2,875,755 (Aug. 17, 2004).

Dahl, Mattias et al., "Acoustic Echo and Noise Cancelling Using Microphone Arrays", International Symposium on Signal Processing and its Applications, ISSPA, Gold coast, Australia, Aug. 25-30, 1996, pp. 379-382.

Demol, M. et al. "Efficient Non-Uniform Time-Scaling of Speech With WSOLA for CALL Applications", Proceedings of InSTIL/ICALL2004—NLP and Speech Technologies in Advanced Language Learning Systems—Venice Jun. 17-19, 2004.

(56) References Cited

OTHER PUBLICATIONS

Laroche, Jean. "Time and Pitch Scale Modification of Audio Signals", in "Applications of Digital Signal Processing to Audio and Acoustics", The Kluwer International Series in Engineering and Computer Science, vol. 437, pp. 279-309, 2002.

Moulines, Eric et al., "Non-Parametric Techniques for Pitch-Scale and Time-Scale Modification of Speech", Speech Communication, vol. 16, pp. 175-205, 1995.

Verhelst, Werner, "Overlap-Add Methods for Time-Scaling of Speech", Speech Communication vol. 30, pp. 207-221, 2000.

* cited by examiner

SYSTEM AND METHOD FOR PROVIDING VOICE EQUALIZATION

CROSS-REFERENCE TO RELATED APPLICATION

This application is a divisional of U.S. patent application Ser. No. 12/004,788, filed on Dec. 21, 2007 (issued on May 15, 2012 as U.S. Pat. No. 8,180,064), which is herein incorporated by reference.

BACKGROUND OF THE INVENTION

1. Field of Invention

The present invention relates generally to audio processing and more particularly to voice equalization.

2. Description of Related Art

Environmental and other background noises pose a challenge for both transmission and reception of speech over communication channels. The noise may corrupt voice signals such that transmitted speech signals are reduced in audibility and intelligibility. For example, if the speech signal originates from a noisy environment and has not been properly noise suppressed prior to transmission, a receiving listener will have to cope with this noise mixed in with the speech.

Additionally, local noise may interfere with reception of speech from a far end (e.g., remote environment) as perceived by a listener. That is, local noise may interfere with the listener's ability to discern received speech. In many cases, playback of the received speech signal may occur through a small loudspeaker, such as that found on a cellular phone. The size restriction of this loudspeaker may introduce limitations in terms of frequency response and power handling capability of the audio device (e.g., mobile phone). The received speech signal may be masked by the local noise. As a result the intelligibility and audibility of the speech signal is reduced.

Currently, there are many methods for reducing background noise in an adverse audio environment prior to transmission. However, these systems do not take into account local noise at the receiver's end. Therefore, it is desirable to be able to provide voice equalization that improves audibility and intelligibility of received speech signals in a noisy local environment.

SUMMARY OF THE INVENTION

Embodiments of the present invention overcome or substantially alleviate prior problems associated with output of audio via a loudspeaker in a noisy near-end environment. In exemplary embodiments, acoustic signals are received from both a near-end and a far-end environment. The acoustic signals for the near-end environment may be received by one or more microphones. The acoustic signal for the far-end environment may be received from a network via a receiver.

A power spectrum estimate for the far-end signal and a noise estimate based on the near-end signal are determined. In exemplary embodiments, after frequency analysis of the far-end signal, an energy module calculates a power spectrum estimate for the far-end signal as well as a primary and secondary acoustic signal from the near-end environment. The power spectrum estimates of the primary and secondary acoustic signals may then be used to calculate an inter-microphone level difference (ILD). The ILD may be utilized for voice activity detection by a noise estimate module to determine the noise estimate.

A voice equalization (i.e., final modification) mask based on the power spectrum estimate of the far-end signal and the noise estimate based on the near-end signal is generated and applied to the far-end signal to obtain a modified signal. The voice equalization mask may be based on the power spectrum estimate of the far-end signal and the noise estimate based on the near-end signal. In exemplary embodiments, the voice equalization mask is a result of combining a modification gain ($G_S$), a global gain ($G_O$), and local gains ($G_N$).

The modified signal may then be dynamically processed to obtain a voice equalization audio signal which may be output via the loudspeaker. The dynamic processing may comprise generating a limit gain ($G_L$) that prevents signal peaks from exceeding a pre-defined value, generating a smoother gain ($G_P$) that smoothes a waveform to prevent quick energy changes, and combining the limit gain ($G_L$) and the smoother gain ($G_P$) and interpolating a result to a predetermined sampling rate.

DESCRIPTION OF EXEMPLARY EMBODIMENTS

The present invention provides exemplary systems and methods for enhancing a received acoustic signal. In exemplary embodiments, the acoustic signal comprises a speech signal. Embodiments of the present invention may be practiced on any audio device that is configured to receive signals such as, but not limited to, cellular telephones, phone handsets, headsets, and conferencing systems. While some embodiments of the present invention will be described in reference to operation on a cellular telephone, the present invention may be practiced on any audio communication device.

Advantageously, exemplary embodiments are configured to improve audibility and intelligibility for acoustic signals that are sent from a noisy far-end (e.g., remote) environment, improve audibility and intelligibility for acoustic signals received in a noisy near-end (e.g., local) environment and/or any combination of these features. Acoustic signals sent from a noisy far-end environment may be processed by a noise suppression engine that attempts to remove the noise. Acoustic signals received in a noisy near-end environment may be processed through a voice equalization engine configured to manipulate the signal such that a louder sound compensates for the near-end noise and is perceived with less audible distortion.

Figure 1:
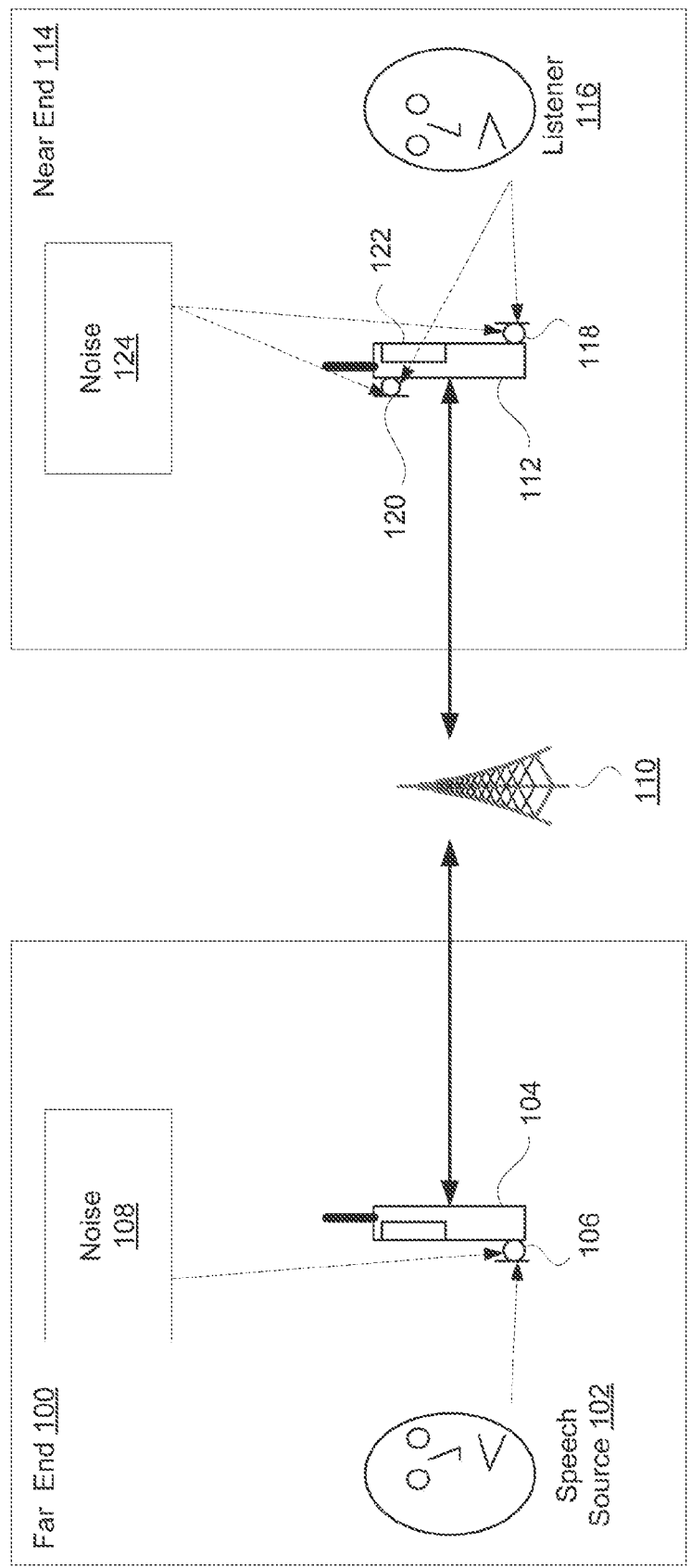
FIG. 1 is an environment in which embodiments of the present invention may be practiced.

Referring to FIG. 1, an instance in which embodiments of the present invention may be practiced is shown. A user in a far-end (e.g., remote) environment 100 acts as a speech source 102 to an audio communication device 104. The exemplary communication device 104 may comprise a primary microphone 106. In some embodiments, the microphone 106 comprises an omni-directional microphone. In an alternative embodiment, the communication device 104 may comprise two microphones (e.g., the primary microphone 106 and a secondary microphone). In one example, the primary microphone 106 may be relatively close to the speech source 102 and a secondary microphone may be located a distance away from the primary microphone 106. In other alternative embodiments, the communication device 104 may comprise any number of microphones.

While the microphone 106 receives speech (i.e., speech signals) from the speech source 102, the microphone 106 may also pick up noise 108. Although the noise 108 is shown coming from a single location in FIG. 1, the noise 108 may comprise any sounds from one or more locations different than the speech source 102, and may include reverberations and echoes. The noise 108 may be stationary, non-stationary, and/or a combination of both stationary and non-stationary noise.

An acoustic signal including the speech and noise 108 may then be transmitted via a communication network 110 to a receiving communication device 112 at a near-end (e.g., local) environment 114 relative to a listener 116. The communication device 112, itself, may comprise a primary microphone 118 and a secondary microphone 120, as well as a loudspeaker 122 through which the listener 116 may hear the acoustic signal from the speech source 102. The near-end environment 114 may further include local noise 124 that can interfere with the listener's 116 comprehension of the received acoustic signal.

It should be noted that the listener 116 may also be a speech source for a far-end listener (i.e., speech source 102). As such, noise 124 in the near-end environment 114 may also be picked up with the listener's speech at the communication device 112 and transmitted to the far-end environment 100.

Some embodiments of the present invention utilize level differences (e.g., energy differences) between the acoustic signals received by the two microphones 118 and 120. Because the primary microphone 118 is much closer to the speaking listener 116 than the secondary microphone 120, the intensity level is higher for the primary microphone 118 resulting in a larger energy level during a speech/voice segment, for example. In various embodiments, microphone arrays for beamforming may be used to derive the level differences.

In some embodiments, the level difference may then be used to discriminate speech frames from noise frames and drive a noise estimate in the frequency domain. Further embodiments may use a combination of energy level differences and time delays to discriminate speech frames from noise frames. Based on binaural cue decoding, speech signal extraction or speech enhancement may be performed.

Similar to the noise 108, the noise 124 may comprise any sounds from one or more locations different than the listener 116, and may include reverberations and echoes. The noise 124 may be stationary, non-stationary, and/or a combination of both stationary and non-stationary noise.

Figure 2:
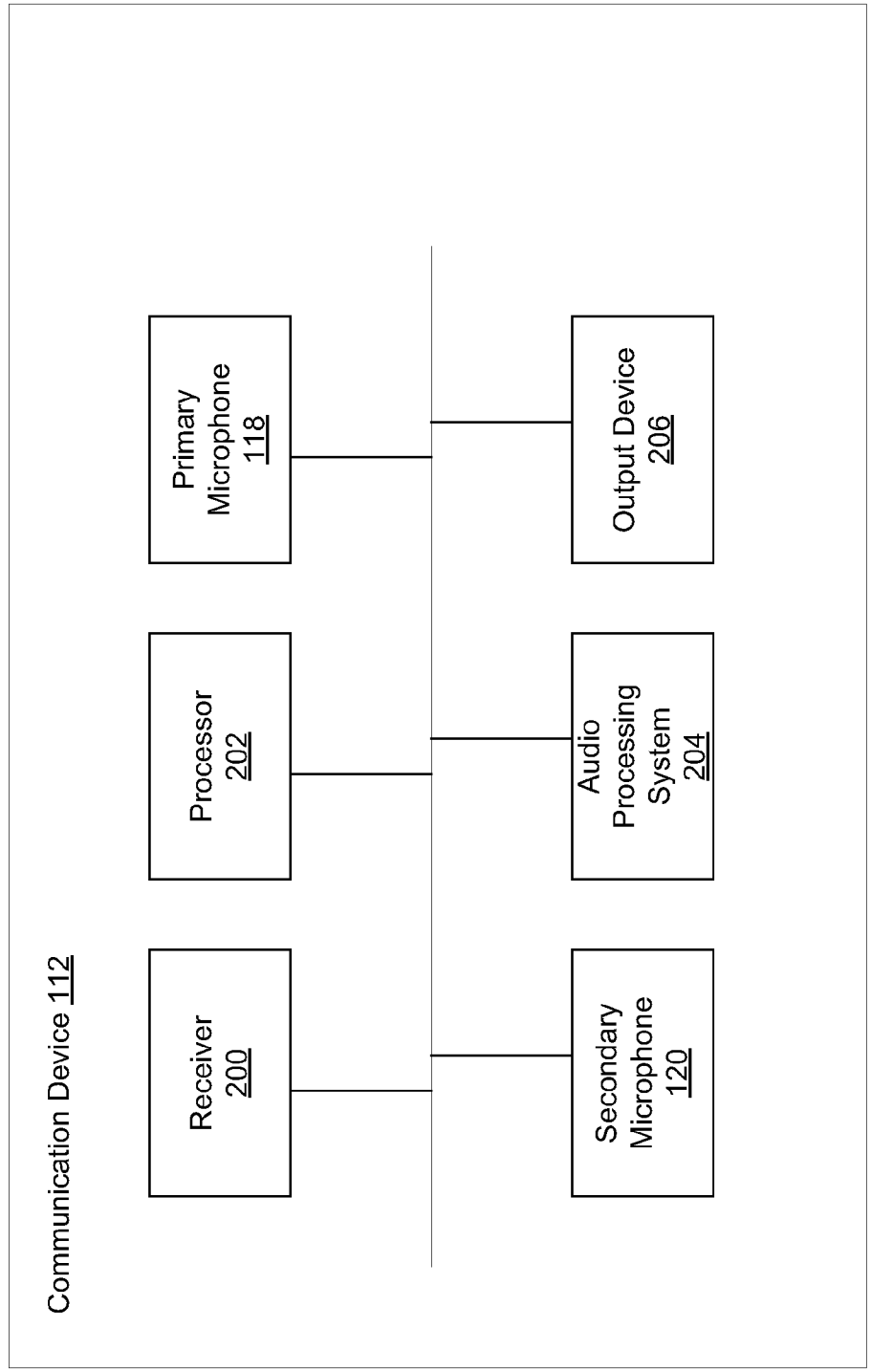
FIG. 2 is a block diagram of an exemplary communication device.

Referring now to FIG. 2, the exemplary communication device 112 of the listener 116 is shown in more detail. In exemplary embodiments, the communication device 112 is an audio receiving device that comprises a receiver 200, a processor 202, the primary microphone 118, the secondary microphone 120, an audio processing system 204, and an output device 206. The communication device 112 may comprise more or less components necessary for communication device 112 operations. It should be noted that the communication device 104 at the far-end environment 100 may comprise similar components as the communication device 112 of the near-end environment 114.

The exemplary receiver 200 is an acoustic sensor configured to receive a far-end signal from the network. In some embodiments, the receiver may comprise an antenna device. The received far-end signal may then be forwarded to the audio processing system 204.

The audio processing system 204 is configured to receive the acoustic signals from primary microphone 106 and process the acoustic signals. After reception by the microphone, the acoustic signals may be converted into electric signals (i.e., a primary electric signal). The electric signals may themselves be converted by an analog-to-digital converter (not shown) into digital signals for processing in accordance with some embodiments.

In some embodiments, the communication device 104 comprises the primary microphone 106 and a secondary microphone. In one example, the audio processing system 204 is configured to receive the acoustic signals from the primary microphone 106 and the secondary microphone and process the acoustic signals. The acoustic signal received by the primary microphone 106 is a primary acoustic signal, while the acoustic signal received by the secondary microphone is the secondary acoustic signal. It should be noted that embodiments of the present invention may be practiced utilizing any number of microphones.

The output device 206 is any device that provides an audio output to the listener 116. For example, the output device 206 may comprise an earpiece of a headset or handset, or the loudspeaker 122 (e.g., a speaker) on the communication device 112.

Figure 3A:
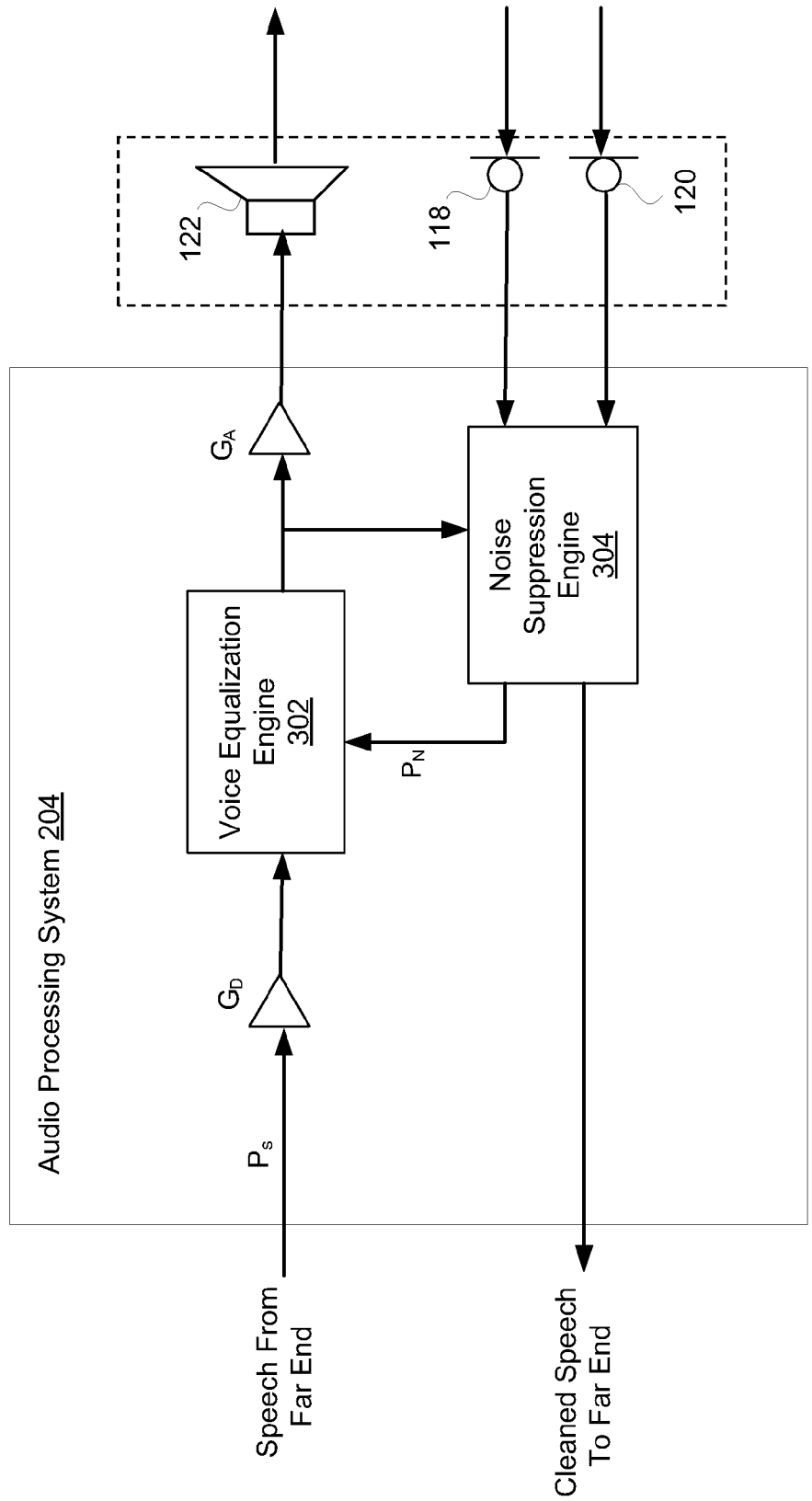
FIG. 3a is a functional block diagram of an exemplary speech enhancement system.

FIG. 3a is a functional diagram of the exemplary audio processing system 204 coupled to other components of the communication device 112. In exemplary embodiments, the audio processing system 204 is embodied within a memory device of the communication device 112.

In accordance with exemplary embodiments, the audio processing system 204 receives the acoustic signals. A root mean square (RMS) level of the far-end speech signal ($P_S$) is determined. A fixed input gain, $G_D$, may then be applied to $P_S$ before processing by a voice equalization engine 302. $G_D$ is associated with a digital volume control set by the listener 116. The voice equalization engine 302 also receives a noise estimate, $P_N$, from a noise suppression engine 304. The noise suppression engine 304 will be discussed in more details in connection with FIG. 5 below.

In exemplary embodiments, performance of the voice equalization engine 302 may be associated with a target signal-to-noise ($SNR_T$). This $SNR_T$, in one embodiment, may be implicitly set by the listener 116 through the digital volume control (fixed input gain $G_D$), level of the noise (noise estimate $P_N$), and level of the far-end speech signal ($P_S$) measured at an instance when the listener 116 sets the volume as represented by an equation, $SNR_T=P_S+G_D+G_P-P_N$.

Figure 3B:
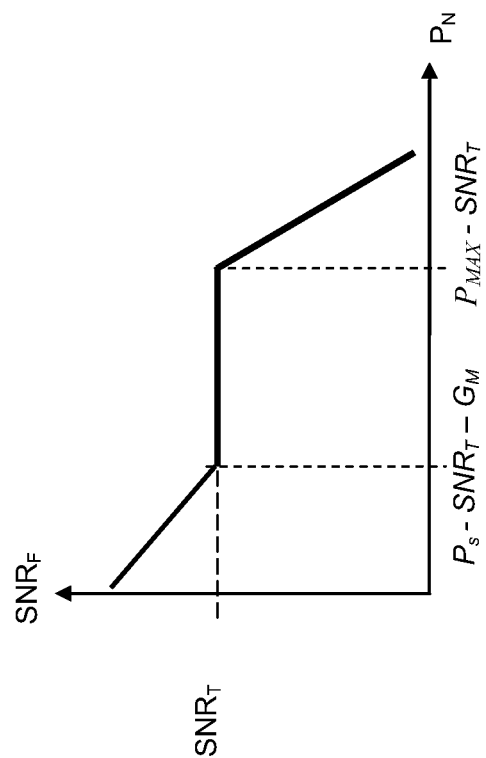
FIG. 3b is a graph of signal-to-noise ratios as a function of system constraints and noise levels.

The smoother gain, $G_P$, is a gain applied by the voice equalization engine 302 at an instance of a last user input (i.e., gain for previous input). Thus, if the noise level changes, the voice equalization engine 302 may attempt to maintain the SNR equal to $SNR_T$ by applying a new voice equalization gain, $G_F$. In one embodiment, $G_F$ may be limited by power headroom available. The power headroom comprises a difference in level between a highest level present in a given acoustic signal and a maximum level the communication device 112 can handle without noticeable distortion. This determination may assume that an amplifier gain, $G_A$, of the communication device 112 is a fixed maximum gain for the amplifier. It should be noted that since the headroom may be limited, the actual SNR achieved by the voice equalization engine 302 may not reach $SNR_T$ as shown in FIG. 3b.

In embodiments where $SNR_T$ is higher than actual SNR, it is not desirable to attenuate the far-end signal below some limit relative to a current value. As a result, a lower bound on a feature gain, $G_M$, may be set. The SNR produced by the voice equalization engine 302 may then be defined by $SNR_F = P_S + G_D + G_F - P_N$ where $G_F$ is the new voice equalization gain. In order to achieve $SNR_T$, $G_F$ may be defined by $G_F = SNF_T - P_S - G_D + P_N$. However, since the minimum and maximum output levels may be limited, the actual SNR achieved by the voice equalization engine 302 may be defined by $SNR_F = \max(\min(P_S + G_D + G_F, P_{MAX}), P_S - G_M) - P_N$.

As shown, effectiveness of the voice equalization engine 302 may be limited by several factors. These factors may include maximum power, headroom, and noise level in the near-end environment 114.

Although FIG. 3a depicts two microphones (e.g., the primary microphone 106 and the secondary microphone), various embodiments comprising any number of microphones may be used to receive one or more signal(s) and determine a noise estimate.

Figure 4:
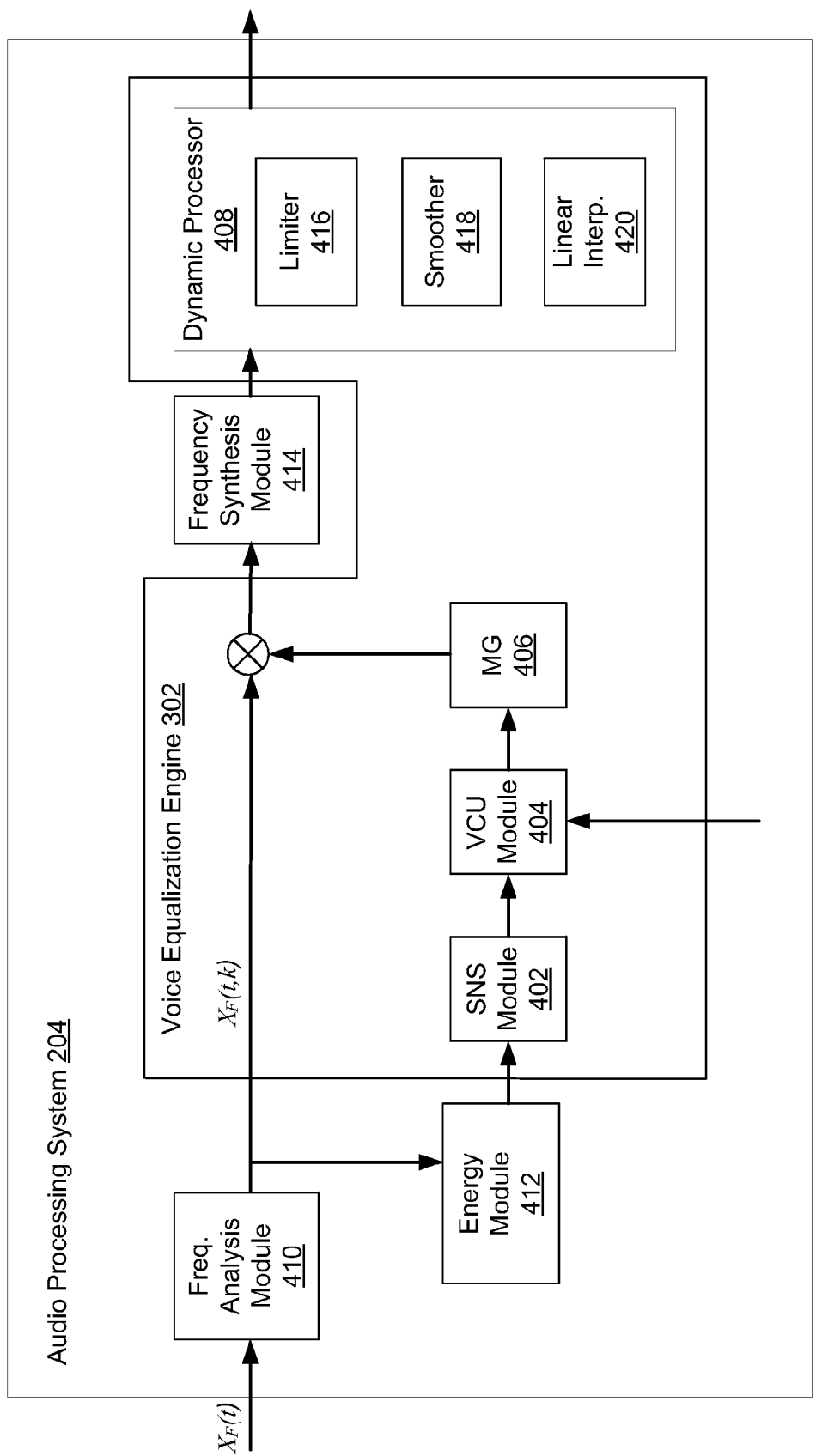
FIG. 4 is a block diagram of an exemplary voice equalization engine coupled to other components of the speech enhancement system.

Referring now to FIG. 4, a detailed block diagram of an exemplary voice equalization engine 302 coupled to other components of the audio processing system 204 is shown. As discussed, the voice equalization engine 302 is configured to compensate for noise (both far-end and near-end) and process the acoustic signals to obtain better sound quality with less audible distortion. In exemplary embodiments, the voice equalization engine 302 may comprise a stationary noise suppression (SNS) module 402, a volume control and unmasking (VCU) module 404, a mask generator (MG) 406, and a dynamic processor 408 as will be discussed further below.

In operation, the acoustic signal from the far-end environment 100, $X_F(t)$, is received from the network 110 and converted to electric signals and processed through a frequency analysis module 410. In one embodiment, the frequency analysis module 410 takes the acoustic signal and mimics the frequency analysis of the cochlea (i.e., cochlear domain) simulated by a filter bank. In one example, the frequency analysis module 410 separates the acoustic signal into frequency bands. Alternatively, other filters such as short-time Fourier transform (STFT), Fast Fourier Transform, Fast Cochlea transform, sub-band filter banks, modulated complex lapped transforms, cochlear models, a gamma-tone filter bank, wavelets, or any generalized spectral analysis filter/method may be used. Because most sounds (e.g., acoustic signals) are complex and comprise more than one frequency, a sub-band analysis on the acoustic signal determines what individual frequencies are present in the acoustic signal during a frame (e.g., a predetermined period of time). According to one embodiment, the frame is 5 to 10 ms long.

The signals are then forwarded to an energy module 412 which computes energy/power estimates during an interval of time for each frequency of data frame of the acoustic signal. As a result, a power spectrum of the acoustic signal across all frequency bands may be determined by the energy module 412.

The power spectrum estimate for each data frame $P_S$ is then forwarded to the SNS module 402, which is configured to estimate a noise component and generate a modification gain, $G_S$. The SNS module 402 may comprise a noise estimator that computes a far-end noise estimate $P_E$ (i.e., a noise power spectrum estimate) and an enhancement filter that uses the $P_S$ and $P_E$ to compute the modification gain $G_S$. In one embodiment a stationary noise suppressor is used, but other single-channel non-stationary noise suppressors can be used as well. In alternative embodiments, the VCU module 404 may scale $G_S$ in non-speech regions in order to maintain a constant perceived noise level.

$G_S$ and $P_S$ may then be forwarded to the VCU module 404. The VCU module 404 also receives the power spectrum estimate of the near-end noise, $P_N$, from the noise suppression engine 304. In exemplary embodiments, the VCU module 404 performs three main functions. The first function is to determine a global gain, $G_O$, for the far-end signal such that $SNR_T$ is achieved upon playback. This may be accomplished by estimating the SNR in the environment using $P_N$ and $P_S$. The second function is to compute a spectral equalization gain, $G_N$, which may be applied to a scaled far-end signal in order to unmask signal components that may be masked by the near-end noise. The final function of the VCU module 404 is to modify the far-end noise suppression gain, $G_S$, so that the perceived noise level after suppression remains relatively constant in spite of the gain modifications applied by $G_N$ and $G_O$.

In exemplary embodiments, the VCU module 404 analyzes the far-end signal and $P_N$ to determine two gain functions, the global gain (i.e., per frame), $G_O$, and the local gain, $G_N$ (i.e., per tap) for each input frame. $G_O$ may be a scalar and may correspond to $G_F$ as discussed above. According to one embodiment, the goal of the $G_O$ is to achieve and maintain the $SNR_T$ as specified during run time by both user settings (e.g., digital gain, $G_D$) and the acoustic conditions at the moment at which the user sets the volume. In one example, $G_N$ may comprise a vector that represents a spectral equalization function.

Since the global gain, $G_O$, may be computed in the frequency domain (e.g., using a fast cochlea transform (FCT)) there may be several considerations. First, the input signal power may be multiplied by a square of the SNS gain function, $G_S$, to obtain an estimate of the speech power by an equation, $\tilde{P}_S = G_S^2 P_S$.

The speech power estimate, $\tilde{P}_S$, and near-end noise estimate, $P_N$, may be smoothed in time using leaky integrators with time constants. These time constants may be defined by parameters associated with time constants for long term noise energy smoothing and long term speech energy smoothing. Next, $\tilde{P}_S$ and $P_N$ may be weighted using an equal-loudness "A" curve and integrated in frequency to obtain a global power per frame. A purpose of this weighting is to deemphasize very low and very high frequencies.

Next, power envelopes may be computed using a non-linear (e.g., signal dependent) leaky integrator. For the speech power, the power envelope estimate may be computed as:

$$e_S = \begin{cases} \lambda_1 p_s + (1-\lambda_1)e_{s-1} & \text{if } p_s > e_{s-1} \\ \lambda_2 p_s + (1-\lambda_2)e_{s-1} & \text{if } p_s \le e_{s-1} \end{cases}$$

where $p_s$ is a weighted and integrated speech power and $e_{s-1}$ is a value computed in a previous frame. The forgetting factors, $\lambda_1$ and $\lambda_2$, are such that $\lambda_1$ corresponds to a short time constant and $\lambda_2$ to a longer time constant. $\lambda_1$ and $\lambda_2$ may be defined by parameters whereby the envelope is tracked quickly if it rises and held longer when it decays. In embodiments where a very short time constant is used for tracking the rising power, the result will be a peak tracker. The envelope update may only be performed if the power estimate corresponds to speech energy and exceeds a threshold. This threshold is computed as a scaled, A-weighted and integrated noise estimate $P_E$ from the SNS module 402. The scaling is defined by a parameter that specifies an offset above the noise floor.

For the noise power envelope, en, the same non-linear integrator strategy may be used, with time constants defined by a noise peak envelope estimation. However, the update may be performed continuously according to an embodiment. In an alternative embodiment, the update may only be applied if the near-end speech is absent when the near-end noise estimate is more reliable. In order to account for the frequency response of the loudspeaker 122, the noise may be weighted by an estimate of an inverse of such response in the FCT domain. The response may be computed off-line and stored in a table. Additionally, power normalization of the noise estimate may be required to account for gains applied throughout an audio chain (e.g., microphone sensitivity, pre-amplification, A/D, etc.).

Finally, the global gain may be computed using the power envelopes as:

$$G_O = 10^{SNR_T/10}\sqrt{\frac{e_n}{e_s}}$$

with the constraint that $G_O$ should not exceed the headroom and should not be lower than a value of the parameter, $G_M$. The headroom may be computed based on the parameter, $P_{MAX}$, and a current power estimate as:

$$G_{Omax} = \frac{\gamma 10^{P_{MAX}/10}}{\sqrt{e_s}}$$

where $\gamma$ is a scaling constant that translates the power in the FCT domain into the time domain. Depending on the available headroom and the other parameters, the $SNR_T$ may be achieved after application of the global gain $G_O$.

In some embodiments, the user gain, $G_D$, is implicitly taken into account in the input signal power, $P_S$. When $G_D$ changes, the VCU module 404 uses explicit knowledge of the new gain and the previous gain to adjust the $SNR_T$. This may be performed at the moment the user changes the gain since the power estimates take some time to reach the new value after the new gain is introduced. The time constants (e.g., timers) involved in this process may be implemented and adjusted once a real-time system is available in order to provide a smooth and seamless transition.

Once the global gain, $G_O$, is applied, it may be likely that some speech components may still be masked by the near-end noise. This may be especially true if the $SNR_T$ cannot be reached with the available headroom. The masking can result in poor intelligibility, especially if the noise is non-stationary with components that overlap with the speech signal. In order to address this issue, a local gain, $G_N$, which depends on frequency (e.g., tap), is computed such that masked speech components may be made more salient.

In order to determine the $G_N$, first a masking threshold $M_N$ is computed based on the near-end noise power as $M_N = P_N * w$, where ω is a spreading function. Since convolution is applied in the FCT domain, the resulting smoothing is frequency dependent and asymmetrical. This may represent a very crude model of more sophisticated psychoacoustic models where the Bark scale and asymmetrical spreading functions need to be used. In one embodiment, the spreading function is symmetrical in the FCT domain and normalized by its $L_1$ norm.

The local gain may then be computed as $G_N = \sqrt{NSR+1}$, where $$NSR = 10^{SNR_N/10}\frac{M_N}{G_O^2 P_s}$$

and $SNR_N$ is a target unmasking SNR defined by a parameter associated with an unmasking target. In one embodiment, the local gain, $G_N$, may be constrained to be applied to speech components that are above a minimum value (e.g., a minimum NSR or maximum SNR for spectral unmasking) with respect to a target local SNR, thus limiting its maximum value. Additionally, signal components that are close to the noise floor level after SNS processing may not be amplified. A purpose in applying this constraint is to avoid boosting low level speech and noise components that may lead to rough sound and unpleasant artifacts.

Intuitively, the local gain may be acting as an adaptive multi-band compressor which boosts weak signal components that lie within certain levels compared to the near-end and far-end noise components. Signal components which are already unmasked after application of the global gain may not be modified due to the regularization by 1 of the NSR in the equation for $G_N$.

Application of the local gain, $G_N$, may not guarantee that the power headroom will be respected. However, as discussed below, the dynamic processor 408 may enforce the restriction. In further embodiments, a reduction in the global gain based on the total power increase caused by the local gain may be performed.

In order to maintain the level of the stationary noise residual after the SNS module 402, the far-end mask, $G_S$, may be modified according to the local and global gains. This may occur only in noise-only regions. The modification is defined by:

$$\tilde{G}_S = \begin{cases} \frac{G_S}{\min(S_{max}, G_O)} & \text{if noise region} \\ G_S & \text{if speech region} \end{cases}$$

where a maximum attenuation level, $S_{max}$, corresponds to a difference between a maximum suppression level specified by a parameter associated with maximum stationary noise suppression and the SNS suppression level, $S_L$. Determination of speech versus noise regions may be made by finding the mask components down at the noise suppression level (e.g., noise-fill regions).

In one embodiment, a frequency-domain high-pass filter may be utilized to modify the local gain prior to interpolation. This modification may comprise a spectral modification that implements a Butterworth filter.

In exemplary embodiments, the computation of the global and local gains are performed at the frame rate, and interpolation may be necessary to obtain a mask. Since the modification gains are not constrained in terms of their rate of change, simple linear interpolation may result in framing artifacts (e.g., perceived as roughness and granularity). In order to limit the rate of change of the mask, each gain function is interpolated separately subject to different constraints.

For the global gain, $G_O$, slew rate constraints may be chosen such that a fast rise is permitted while a gain fall is slowed down to reduce pumping effects. For the local gain, $G_N$, the rate of change may be allowed to be a lot faster in order to track short-time spectral changes of both the noise and the speech. Adjustment of the slew rates may determine the trade-off between a pumping and tracking speed of the voice equalization engine 302.

The mask generator 406 computes a final mask to be applied to the input acoustic signal received from the network 110 (i.e., the far-end signal). In exemplary embodiments, the interpolated local gain ($G_N$), global gain ($G_O$) and the modified and linearly interpolated noise suppression gain ($G_S$) are independently up-sampled and interpolated to a sampling rate. Then, the three modification gains are combined by the mask generator 406 to obtain the final modification mask.

The final modification mask is then applied to the input signal, $X_F(t,k)$, to obtain a modified far-end signal. The modified far-end signal is then processed through a frequency synthesis module 414 to produce a time domain signal. The time domain signal may not be well suited for playback over the loudspeaker 122 since the time domain signal's dynamic range and slew rate are not limited and may cause excessive distortion. As such, in one embodiment, the time domain signal is sent to the dynamic processor 408, which is configured to minimize distortion upon playback through the loudspeaker 122.

In one embodiment, the dynamic processor 408 comprises a limiter 416, an onset smoother 418, and a linear interpolator 420. The limiter 416 is configured to limit signal envelope peaks, whereas the onset smoother 418 is configured to smear envelope onsets. A purpose of the dynamic processor 408 is to limit dynamic properties of the time domain signal to reduce instantaneous power below a limit that the loudspeaker 122 can handle without sacrificing loudness in steady state regions in the time domain signal.

In exemplary embodiments, the limiter 416 generates a limit gain that prevents signal peaks from exceeding a predefined value as defined by a parameter, $G_{L\text{-}MAX}$. That is, the limiter 416 limits power of the signal prior to entering the loudspeaker 122 so as to prevent audible harmonics without distorting sound. Accordingly, the limiter 416 estimates a signal envelope by computing a maximum absolute value of the waveform (i.e., the time domain signal) in a given frame. The envelope is then smoothed using a non-linear integrator with predetermined parameters, such that the rises are followed very quickly and the falls are tracked more slowly. This "peak" envelope, $e_T$, may be used to compute a limiting gain function as:

$$G_L = \begin{cases} \dfrac{g_L}{e_T} & \text{if } e_T > g_L \\ 1 & \text{else} \end{cases}$$

where the value of $g_L$ is set by the $G_{L\text{-}MAX}$ parameter.

In order to reduce fast energy changes which contribute to loudspeaker 122 rattling, the envelope onset smoother 418 smoothes the waveform. That is, the onset smoother 418 limits quick energy changes by limiting the envelop in terms of its amplitude. Initially, the envelope, $e_T$, is smoothed with a relatively fast time constant. Then, the envelope, $e_T$, is tracked with a slow-rise/fast-decay leaky integrator to derive a "sluggish" envelope, $e_P$, and compute a smoother gain as:

$$G_P = \dfrac{e_P}{e_T}$$

As a result, a slowly rising envelope is imposed on the waveform, while leaving the offset mostly unaffected.

Finally, the two gain functions $G_L$ and $G_P$ are multiplied and interpolated to the sampling rate (since they are computed per frame) with the constrained linear interpolator 420 using predetermined slew rates. It should be noted that correct adjustment of various time constants and slew rates is critical to avoid overshoots, which may result in "click" artifacts. The final result is then applied to the modified far-end signal.

Figure 5:
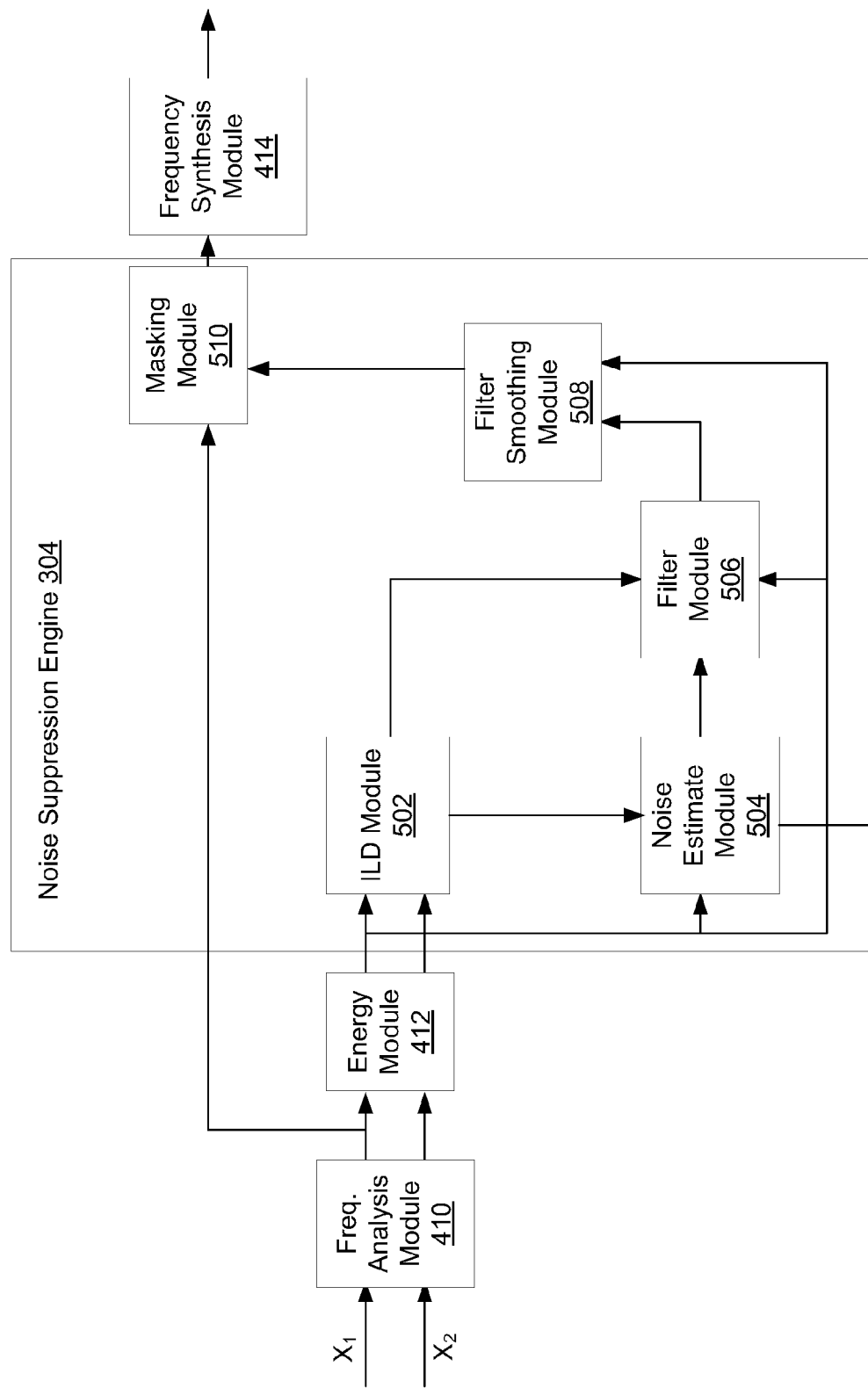
FIG. 5 is a block diagram of an exemplary noise suppression engine.

Referring now to FIG. 5, a detailed block of the exemplary noise suppression engine 304 is shown. In operation, the acoustic signals received from the primary and secondary microphones 118 and 120 of the near-end communication device 112 are converted to electric signals and processed through the frequency analysis module 410. In one embodiment, as discussed above, the frequency analysis module 410 takes the acoustic signals and mimics the frequency analysis of the cochlea (i.e., cochlear domain) simulated by a filter bank. In one example, the frequency analysis module 410 separates the acoustic signals into frequency bands. Alternatively, other filters such as short-time Fourier transform (STFT), sub-band filter banks, modulated complex lapped transforms, cochlear models, wavelets, etc., can be used for the frequency analysis and synthesis. Because most sounds (e.g., acoustic signals) are complex and comprise more than one frequency, a sub-band analysis on the acoustic signal determines what individual frequencies are present in the acoustic signal during a frame (e.g., a predetermined period of time). According to one embodiment, the frame is 5-10 ms long.

The signals are then forwarded to the energy module 412, which computes energy/power estimates during an interval of time for each frequency band (i.e., power estimates) of an acoustic signal. As a result, a primary spectrum (i.e., the power spectral density of the primary acoustic signal) across all frequency bands may be determined by the energy module 412. Further details regarding the calculation of the power estimates may be found in co-pending application Ser. No. 11/343,524, filed Jan. 30, 2006, and herein incorporated by reference.

Given the calculated energy levels, an inter-microphone level difference (ILD) may be determined by an ILD module 502. In two-microphone embodiments, the power spectrums are used by the ILD module 502 to determine a time and frequency varying ILD. Because the primary and secondary microphones 118 and 120 may be oriented in a particular way, certain level differences may occur when speech is active and other level differences may occur when noise is active. More details regarding the calculation of ILD may be can be found in co-pending U.S. patent application Ser. No. 11/343,524 and co-pending U.S. patent application Ser. No. 11/699,732 filed Jan. 29, 2007, and herein incorporated by reference.

According to an exemplary embodiment of the present invention, a Wiener filter is used to suppress noise/enhance speech. In order to derive a Wiener filter estimate, however, specific inputs are required. These inputs comprise a power spectral density of noise and a power spectral density of the source signal. As such, a noise estimate module 504 may be provided to determine a noise estimate for the acoustic signals.

According to exemplary embodiments, the noise estimate module 504 attempts to estimate the noise components (e.g., noise power estimates) in the microphone signals. In exemplary embodiments, the noise estimate is based only on the acoustic signal from the primary microphone 118. The exemplary noise estimate module 504 is a component that can be approximated mathematically by:

$$N(t,\omega)=\lambda_1(t,\omega)E_1(t,\omega))+(1-\lambda_1(t,\omega))\min[N(t-1,\omega),E_1(t,\omega)]$$

according to one embodiment of the present invention. As shown, the noise estimate in this embodiment is based on minimum statistics of a current energy estimate of the primary acoustic signal, $E_1(t,\omega)$ and a noise estimate of a previous time frame, $N(t-1, \omega)$.

$\lambda I(t,)$ in the above equation is derived from the ILD approximated by the ILD module 502, as:

$$\lambda_I(t,\omega) = \begin{cases} \approx 0 & \text{if } ILD(t,\omega) < \text{threshold} \\ \approx 1 & \text{if } ILD(t,\omega) > \text{threshold} \end{cases}$$

That is, when speech at the primary microphone 118 is smaller than a threshold value (e.g., threshold=0.5) above which speech is expected to be, $\lambda_1$ is small, and thus the noise estimator follows the noise closely. When ILD starts to rise (e.g., because speech is detected), however, $\lambda_1$ increases. As a result, the noise estimate module 504 slows down the noise estimation process and the speech energy does not contribute significantly to the final noise estimate. Therefore, exemplary embodiments of the present invention may use a combination of minimum statistics and voice activity detection to determine the noise estimate. This noise estimate may also be output to the voice equalization engine 302.

A filter module 506 then derives a filter estimate based on the noise estimate. In one embodiment, the filter is a Weiner filter. Alternative embodiments may contemplate other filters. Accordingly, the Weiner filter approximation may be approximated, according to one embodiment, as:

$$W = \left(\frac{P_s}{P_s + P_n}\right)^\alpha,$$

where $P_S$ is a power spectral density of speech and $P_n$ is a power spectral density of noise. According to one embodiment, $P_n$ is the noise estimate, $N(t,\omega)$, which is calculated by the noise estimate module 504. In an exemplary embodiment, $P_S=E_1(t,\omega)-\beta N(t,\omega)$, where $E_1(t,\omega)$ is the energy estimate of the primary microphone 118 from the energy module 412, and $N(t, \omega)$ is the noise estimate provided by the noise estimate module 504. Because the noise estimate changes with each frame, the filter estimate will also change with each frame.

$\beta$ is an over-subtraction term which is a function of the ILD. $\beta$ compensates bias of minimum statistics of the noise estimate module 504 and forms a perceptual weighting. Because time constants are different, the bias will be different between portions of pure noise and portions of noise and speech. Therefore, in some embodiments, compensation for this bias may be necessary. In exemplary embodiments, $\beta$ is determined empirically (e.g., 2-3 dB at a large ILD, and is 6-9 dB at a low ILD).

$\alpha$ in the above exemplary Weiner filter equation is a factor that further suppresses the noise estimate. $\alpha$ can be any positive value. In one embodiment, nonlinear expansion may be obtained by setting $\alpha$ to 2. According to exemplary embodiments, $\alpha$ is determined empirically and applied when a body of $$W = \left(\frac{P_s}{P_s + P_n}\right)$$

falls below a prescribed value (e.g., 12 dB down from the maximum possible value of W, which is unity).

Because the Weiner filter estimation may change quickly (e.g., from one frame to the next frame) and noise and speech estimates can vary greatly between each frame, application of the Weiner filter estimate, as is, may result in artifacts (e.g., discontinuities, blips, transients, etc.). Therefore, an optional filter smoothing module 508 is provided to smooth the Weiner filter estimate applied to the acoustic signals as a function of time. In one embodiment, the filter smoothing module 508 may be mathematically approximated as:

$$M(t,\omega)=\lambda_s(t,\omega)W(t,\omega)+(1-\lambda_s(t,\omega))M(t-1,\omega)$$

where $\lambda_s$ is a function of the Weiner filter estimate and the primary microphone energy, $E_1$.

As shown, the filter smoothing module 508 at time (t) will smooth the Weiner filter estimate using the values of the smoothed Weiner filter estimate from the previous frame at time (t−1). In order to allow for quick response to the acoustic signal changing quickly, the filter smoothing module 508 performs less smoothing on quick changing signals, and more smoothing on slower changing signals. This is accomplished by varying the value of $\lambda_s$ according to a weighed first order derivative of $E_1$ with respect to time. If the first order derivative is large and the energy change is large, then $\lambda_s$ is set to a large value. If the derivative is small then $\lambda_s$ is set to a smaller value.

After smoothing by the filter smoothing module 508, the primary acoustic signal is multiplied by the smoothed Weiner filter estimate to estimate the speech. In the above Weiner filter embodiment, the speech estimate is approximated by S $(t, \omega)=X_1(t, \omega)*M(t,\omega)$, where $\lambda_1$ is the acoustic signal from the primary microphone 106. In exemplary embodiments, the speech estimation occurs in a masking module 510.

Next, the speech estimate is converted back into time domain from the cochlea domain. The conversion comprises taking the speech estimate, $S(t, \omega)$, and multiplying this with an inverse frequency of the cochlea channels in a frequency synthesis module 414. Once conversion is completed, the signal may be sent to the far-end communication device 104.

It should be noted that the system architecture of the noise suppression engine 304 is exemplary. Alternative embodiments may comprise more components, less components, or equivalent components and still be within the scope of embodiments of the present invention. For example, the frequency analysis module 410 and energy module 412 may be combined into a single module. In yet another embodiment, the frequency analysis module 410, energy module 412, and/or the frequency synthesis module 414 may comprise separate modules within the voice equalization engine 302 and the noise suppression engine 304.

Figure 6:
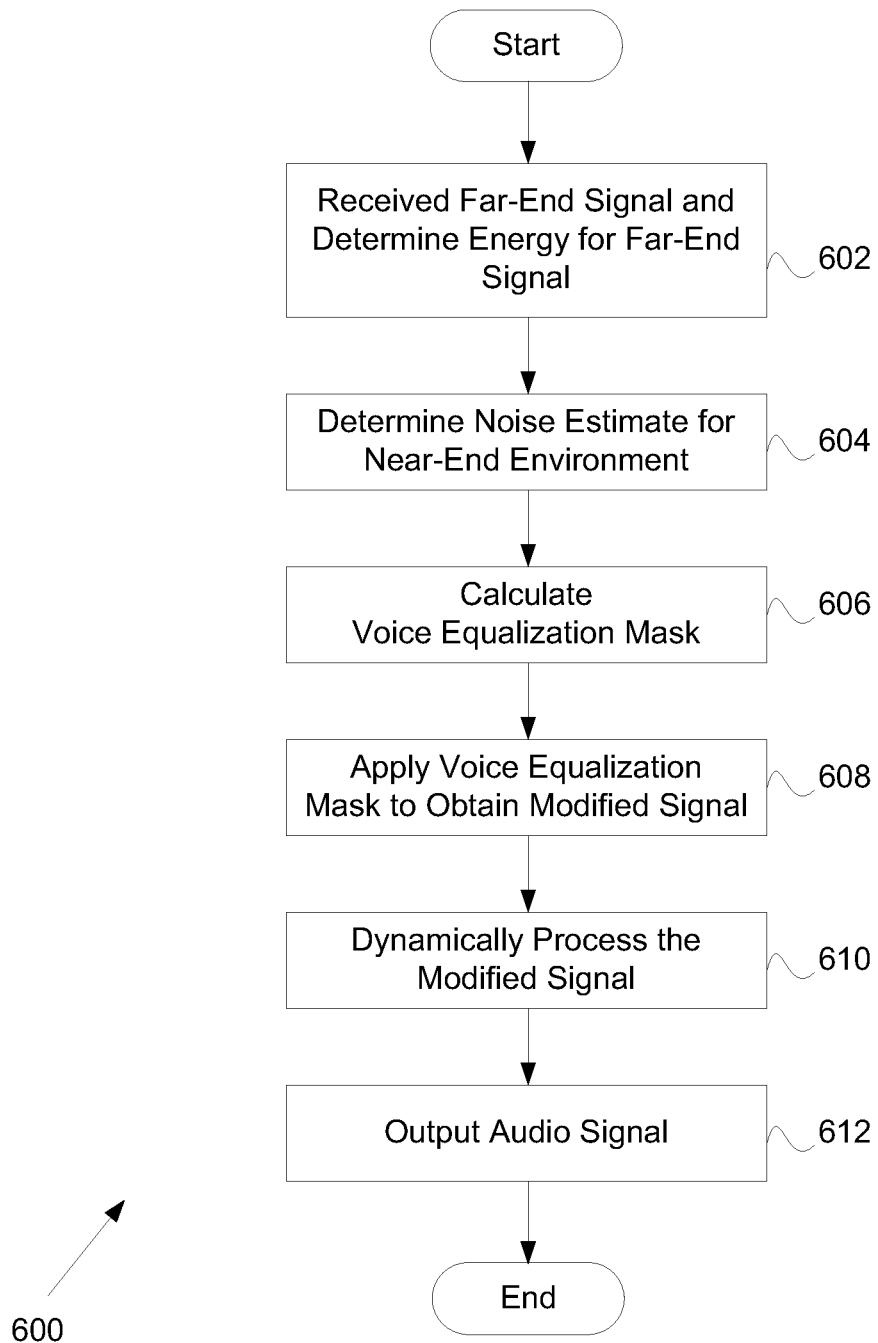
FIG. 6 is a flowchart of an exemplary method for voice equalization according to an exemplary embodiment of the present invention.

Referring now to FIG. 6, an exemplary flowchart 600 of an exemplary method for providing voice equalization is shown. In step 602, a far-end signal is received by the communication device 112 and forwarded to the audio processing system 204. In exemplary embodiments, the far-end signal is received from the network 110 by a receiver of the communication device 112. The audio processing system 204 then determines a power spectrum estimate of the far-end signal using the frequency analysis module 410 and energy module 412.

The audio processing system 204 also determines a noise estimate for the near-end environment 114 in step 604. In exemplary embodiments, acoustic signals from the near-end environment 114 are received by the primary microphone 106 and a secondary microphone, if one is available. The near-end acoustic signals are then processed through the noise suppression engine 304 to obtain the noise estimate for the near-end environment 114.

Since the far-end signal can be picked up by the primary microphone, the near-end noise suppressor may be able to remove this signal from the noise estimate. In one example, an acoustic echo canceller removes this signal from the noise estimate. In some embodiments, a two-microphone echo suppressor such as the one described co-pending application Ser. No. 12/004,899, filed Dec. 21, 2007, entitled "System and Method for 2-Channel and 3-Channel Acoustic Echo Cancellation" herein incorporated by reference.

In step 606, the voice equalization mask is generated. Step 606 will be discussed in more details in connection with FIG. 7 below.

Once calculated, the voice equalization mask is applied to the far-end signal to obtain a modified far-end signal in step 608. The modified far-end signal is then processed through a frequency synthesis module 414 to produce a time domain signal.

The time domain signal may not be well suited for playback over the loudspeaker 122 since the time domain signal's dynamic range and slew rate are not limited and may cause excessive distortion. As such, the time domain signal may be dynamically processed in step 610 by the dynamic processor 408, which is configured to minimize distortion upon playback through the loudspeaker 122.

In one embodiment, the dynamic processor 408 comprises a limiter 416, an onset smoother 418, and a linear interpolator 420. The limiter 416 is configured to limit signal envelope peaks, whereas the onset smoother 418 is configured to smear envelope onsets. Finally, the two gain functions $G_L$ and $G_P$ calculated by the limiter 416 and the onset smoother 418, respectively, are multiplied and interpolated to the sampling rate (since they are computed per frame) by the constrained linear interpolator 420 using predetermined slew rates. The final result is then applied to the modified far-end signal to produce an enhanced audio signal.

The enhanced audio signal is then output in step 612. In exemplary embodiments, the enhanced audio signal is output through the loudspeaker 122.

Figure 7:
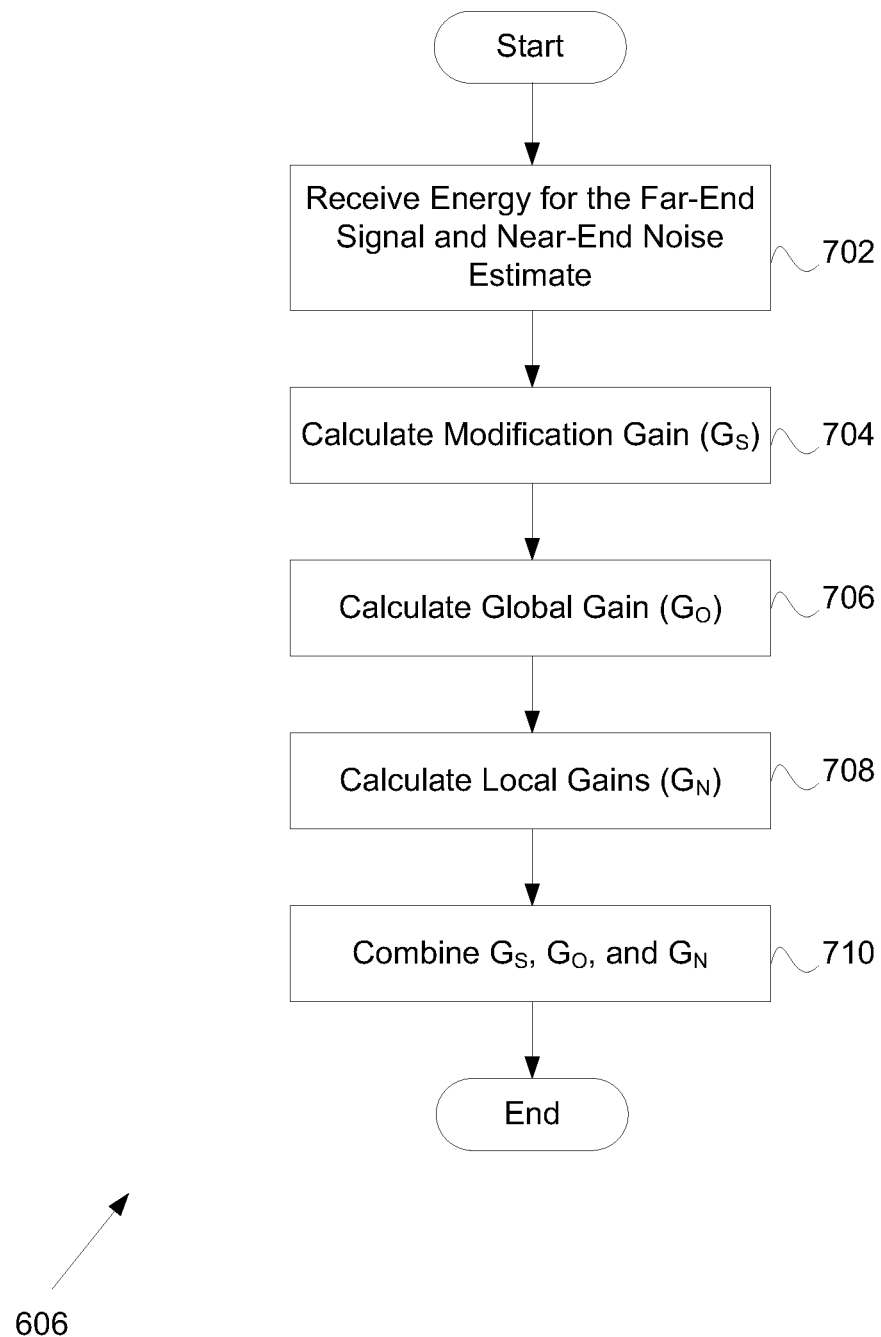
FIG. 7 is a flowchart of an exemplary method for calculating the voice equalization mask.

Referring now to FIG. 7, a flowchart of an exemplary method for calculating the voice equalization mask (step 606) is shown. In step 702, the voice equalization engine 302 receives the energy estimate for the far-end signal and a near-end noise estimate. In exemplary embodiments, the power spectrum estimate for the far-end signal is received from the energy module 412, while the near-end noise estimate is received from the noise suppression engine 304.

In step 704, the modification gain, $G_S$, is calculated. In exemplary embodiments, the SNS module 402 receives the power estimate for each data frame $P_S$. The SNS module 402 may comprise a stationary noise estimator which computes a noise estimate $P_E$ and an enhancement filter which uses the $P_S$ and $P_E$ to compute the modification gain, $G_S$.

In step 706, the global gain (i.e., per frame) $G_O$ is calculated. In exemplary embodiments, the $G_O$ is calculated by the VCU module 404. The VCU module 404 receives $G_S$ and $P_S$ along with the power estimate of the near-end noise, $P_N$, from the noise suppression engine 304. The VCU module 404 then determines the global gain, $G_O$, for the far-end signal such that $SNR_T$ is achieved upon playback. In one embodiment, this may be accomplished by estimating the SNR in the environment using $P_N$ and $P_S$.

The local gain, $G_N$ (i.e., per frequency) for each input frame is calculated in step 708. $G_N$ comprises a spectral equalization gain, which may be applied to a scaled far-end signal in order to unmask signal components that may be masked by the noise. The VCU module 404 may, in some embodiments, modify the far-end noise suppression gain, $G_S$, so that the perceived noise level after suppression remains relatively constant in spite of the gain modifications applied by $G_N$ and $G_O$.

In step 710, the modification gain ($G_S$), global gain ($G_O$), and interpolated local gains ($G_N$) are combined to generate the voice equalization gain. In exemplary embodiments, the mask generator 406 computes the final mask (i.e., voice equalization mask) to be applied to the far-end signal received from the network 110. In exemplary embodiments, the interpolated local gains ($G_N$), global gain ($G_O$) and the modified and linearly interpolated noise suppression gain ($G_S$) are independently up-sampled and interpolated to a sampling rate. Then, the three modification gains are combined by the mask generator 406 to obtain the final mask.

The above-described modules can be comprised of instructions that are stored on storage media. The instructions can be retrieved and executed by a processor. Some examples of instructions include software, program code, and firmware. Some examples of storage media comprise memory devices and integrated circuits. The instructions are operational when executed by the processor 202 to direct the processor 202 to operate in accordance with embodiments of the present invention. Those skilled in the art are familiar with instructions, processor(s), and storage media.

The present invention is described above with reference to exemplary embodiments. It will be apparent to those skilled in the art that various modifications may be made and other embodiments can be used without departing from the broader scope of the present invention. For example, embodiments of the present invention may be applied to any system (e.g., non speech enhancement system) as long as a noise power spectrum estimate is available. Therefore, these and other variations upon the exemplary embodiments are intended to be covered by the present invention.

The invention claimed is:

1. A system for providing voice equalization, comprising:
    an energy module configured to determine a power spectrum estimate of a far-end signal, the far-end signal and a near-end signal each representing at least one respective captured sound received by at least one acoustic sensor;
    a noise suppression engine configured to determine a noise estimate based on the near-end signal; and
    a voice equalization engine configured to generate and apply a voice equalization mask based on the power spectrum estimate of the far-end signal and the noise estimate based on the near-end signal to obtain a modified signal as well as dynamically process the modified signal to obtain an enhanced audio signal.

2. The system of claim 1 wherein the noise suppression engine is further configured to dynamically process a modified far-end signal to generate the voice equalization audio signal, the system further comprising the at least one acoustic sensor.

3. The system of claim 1 wherein the voice equalization engine comprises a stationary noise suppression (SNS) module configured to generate a modification gain ($G_S$).

4. The system of claim 1 wherein the voice equalization engine comprises a volume control and unmasking (VCU) module configured to generate a global gain ($G_O$) and a plurality of local gains ($G_N$).

5. The system of claim 1 wherein the voice equalization engine comprises a mask generator configured to combine a modification gain ($G_S$), a global gain ($G_O$), and local gains ($G_N$) to generate a final modification mask.

6. The system of claim 1 wherein the voice equalization engine comprises a limiter configured to generate a limit gain ($G_L$) that prevents signal peaks from exceeding a pre-defined value.

7. The system of claim 1 wherein the voice equalization engine comprises an onset smoother configured to generate a smoother gain ($G_P$) that smoothes a waveform to prevent quick energy changes.

8. The system of claim 1 wherein the voice equalization engine comprises a linear interpolator configured to combine a limit gain ($G_L$) and a smoother gain ($G_P$) and interpolating a result to a predetermined sampling rate.

9. The system of claim 1 wherein the noise suppression engine comprises a level difference module configured to determine a level difference between power estimates of a primary acoustic signal and a secondary acoustic signal from a near-end environment.

10. The system of claim 9 wherein the noise suppression engine comprises a noise estimate module configured to determine the noise estimate of the near-end signal based on the level difference.

11. The system of claim 1 wherein the voice equalization engine comprises a mask generator configured to combine a modification gain ($G_S$), a global gain ($G_O$), and local gains ($G_N$) to maintain a constant signal-to-noise (SNR) target.

12. A non-transitory computer-readable storage medium having embodied thereon a program, the program providing instructions to a processor when executed would perform a method for providing voice equalization, the method comprising:
   determining a power spectrum estimate of a far-end signal, the far-end signal and a near-end signal each representing at least one respective captured sound received by at least one acoustic sensor;
   determining a noise estimate based on the near-end signal;
   generating a voice equalization mask based on the power spectrum estimate of the far-end signal and the noise estimate based on the near-end signal;
   applying the voice equalization mask to the far-end signal to obtain a modified signal; and
   dynamically processing the modified signal to obtain an enhanced audio signal.

13. The non-transitory computer-readable storage medium of claim 12 wherein generating the voice equalization mask comprises generating a modification gain ($G_S$).

14. The non-transitory computer-readable storage medium of claim 12 wherein generating the voice equalization mask comprises generating a global gain ($G_O$).

15. The non-transitory computer-readable storage medium of claim 12 wherein generating the voice equalization mask comprises generating local gains ($G_N$).

16. The non-transitory computer-readable storage medium of claim 12 wherein generating the voice equalization mask comprises combining a modification gain ($G_S$), a global gain ($G_O$), and local gains ($G_N$) to generate a final modification mask.

17. The non-transitory computer-readable storage medium of claim 12 wherein dynamically processing the modified signal comprises generating a limit gain ($G_L$) that prevents signal peaks from exceeding a pre-defined value.

18. The non-transitory computer-readable storage medium of claim 12 wherein dynamically processing the modified signal comprises generating a smoother gain ($G_P$) that smoothes a waveform to prevent quick energy changes.

19. The non-transitory computer-readable storage medium of claim 12 wherein dynamically processing the modified signal comprises combining a limit gain ($G_L$) and a smoother gain ($G_P$) and interpolating a result to a predetermined sampling rate.

20. The non-transitory computer-readable storage medium of claim 12 wherein determining the noise estimate comprises receiving a primary acoustic signal via a primary microphone and receiving a secondary acoustic signal via a secondary microphone and determining an inter-microphone level difference between the primary and the secondary acoustic signals.

* * * * *